United States Patent [19]
McGinn et al.

[11] Patent Number: 6,137,852
[45] Date of Patent: Oct. 24, 2000

[54] PHASE DETECTOR CIRCUIT AND METHOD OF PHASE DETECTING

[75] Inventors: Michael McGinn, Tempe; David Kevin Lovelace, Chandler, both of Ariz.

[73] Assignee: Motorola, Inc, Schaumburg, Ill.

[21] Appl. No.: 08/996,903

[22] Filed: Dec. 23, 1997

[51] Int. Cl.[7] .................................................. H03D 3/24
[52] U.S. Cl. .......................................... 375/375; 375/327
[58] Field of Search ..................................... 455/313, 314,
455/317, 323, 324, 302, 303, 304; 375/215,
294, 327, 330, 332, 283, 375, 371; 327/236,
244, 2, 3, 5; 331/1, 25, 11, 12; 329/307,
306, 325, 327, 360

[56] References Cited

U.S. PATENT DOCUMENTS

| | | | |
|---|---|---|---|
| 4,394,626 | 7/1983 | Kurihara et al. | 331/12 |
| 4,630,052 | 12/1986 | Galati et al. | 342/159 |
| 4,814,727 | 3/1989 | Mower | 331/2 |
| 4,888,564 | 12/1989 | Ishigaki | 331/1 |
| 5,028,887 | 7/1991 | Gilmore | 331/18 |
| 5,179,359 | 1/1993 | McLeod | 331/38 |
| 5,216,387 | 6/1993 | Telewski et al. | 331/11 |
| 5,499,274 | 3/1996 | Brown | 375/376 |
| 5,657,122 | 8/1997 | Curbelo et al. | 356/346 |
| 5,742,207 | 4/1998 | Rambo et al. | 331/11 |
| 5,808,462 | 9/1998 | Fuji et al. | 324/76.13 |
| 5,831,461 | 11/1998 | Dawe | 327/147 |
| 5,847,891 | 12/1998 | Ohmori et al. | 360/65 |
| 5,952,853 | 9/1999 | Willingham et al. | 327/8 |

*Primary Examiner*—Chi H. Pham
*Assistant Examiner*—Emmanuel Bayard
*Attorney, Agent, or Firm*—Lanny L. Parker

[57] ABSTRACT

An image reject receiver (10) uses a mixer circuit (12) and a mixer circuit (16) to frequency translate an incoming reference signal ($RF_{IN}$) and generate a first output signal ($V_{OUT1}$) and a second output signal ($V_{OUT2}$), respectively. Two phase detectors (26 and 36) measure a phase difference between the first and second output signals ($V_{OUT1}$ and $V_{OUT2}$) and a difference circuit (30) provides a difference value in accordance with the phase difference. The difference value cancels any phase shift due to time delays associated with the phase detectors (26 and 36). The difference value is fed back to a phase shift circuit (20) for adjusting the phase of the second output signal ($V_{OUT2}$) and locking the first output signal ($V_{OUT1}$) in-phase with the second output signal ($V_{OUT2}$).

6 Claims, 4 Drawing Sheets

PHASE DETECTOR CIRCUIT AND METHOD OF PHASE DETECTING

BACKGROUND OF THE INVENTION

The present invention relates, in general, to integrated circuits and, more particularly, to integrated circuits having phase detectors.

In electronic systems such as cellular or wireless telephones, and synchronous demodulators, among others, a phase and frequency relationship exists between an incoming reference signal or a lower frequency translated signal and a signal generated by a voltage Controlled Oscillator (VCO). Typically, an analog phase detector locks the VCO generated signal to the incoming reference signal such that the two signals are ninety degrees out of phase with respect to each other, i.e., the two signals are phase-locked in quadrature.

The incoming reference signal can be a modulated signal containing information that is recovered in a receiver of the electronic system. The modulated signal and the signal generated by the Local Oscillator (LO) can be mixed to translate the frequency of the modulated signal from a Radio Frequency (RF) range to a signal in a lower Intermediate Frequency (IF) range before being demodulated. Additionally, in an image rejection receiver the reference signal can be mixed with a phase shifted signal from the VCO to generate a second translated signal in the IF range. An additional ninety degree phase shift in the second signal causes the second IF signal to be in-phase with the first IF signal. Translating the modulated signal to generate first and second signals that are in phase with each other allows the information in the modulated signal to be recovered and the image signals to be canceled.

However, the combined phase shifting of the two phase shifters used in generating the second signal should equal one hundred and eighty degrees as one of the conditions for image cancellation. Any inaccuracies in phase shifting generate an undesired quadrature component during translation of the modulated signal. Thus, accurate phase shifting is necessary for preventing an undesired quadrature distortion in the modulated signal information and an increase in the undesired image signal.

Accordingly, it would be advantageous to have a method and receiver circuit for locking the reference signal in-phase with the VCO generated signal. It would be of further advantage for the receiver circuit to be capable of operating at high frequencies.

DETAILED DESCRIPTION OF THE DRAWINGS

Generally, the present invention provides phase detection for a Phase Lock Loop (PLL) system that causes two signals to be locked in-phase with each other. One of the two signals could be a reference signal that is locked to a signal generated by a Voltage Controlled Oscillator (VCO). Alternatively, the two signals could be frequency translated signals provided through mixer circuits. A phase detection circuit generates an output having an amplitude in accordance with a phase difference between the two signals.

Figure 1:
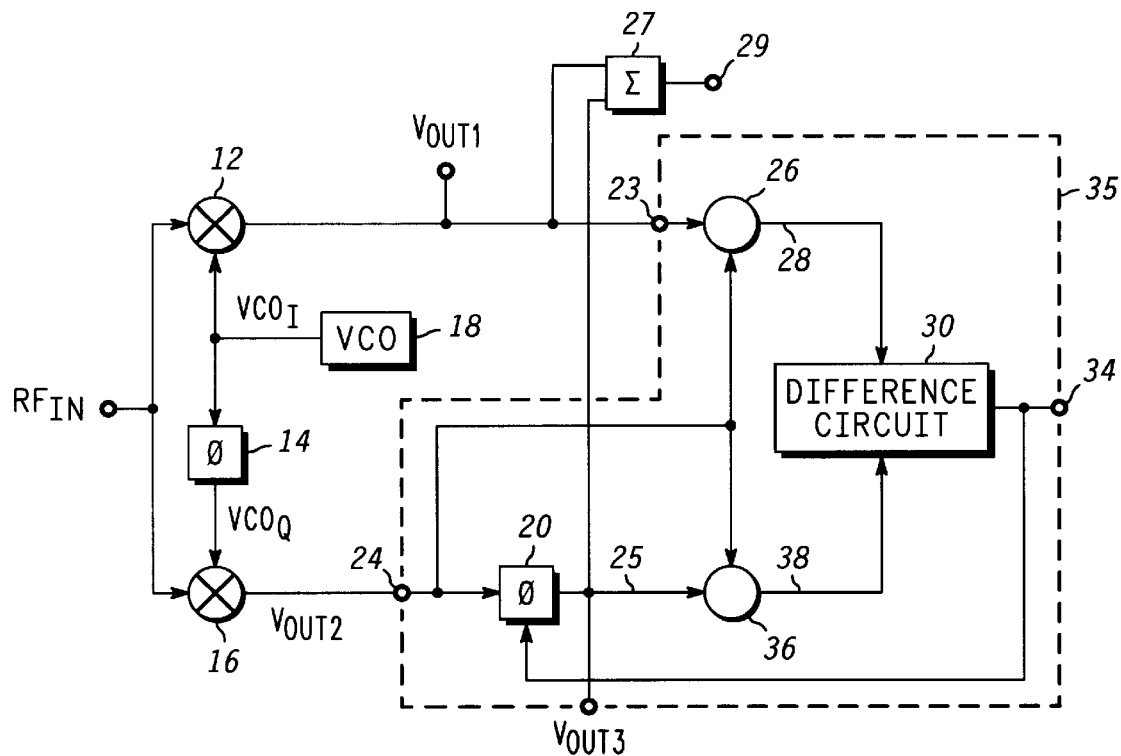
FIG. 1 is a block diagram of an image reject receiver in accordance with the present invention.

FIG. 1 is a block diagram of an image reject receiver 10 in accordance with the present invention. Image reject receiver 10 is also referred to as a down converter. Image reject receiver 10 includes two mixer circuits, 12 and 16, each having an input coupled for receiving the transmitted reference signal $RF_{IN}$. A second input of mixer circuit 12 is commonly connected to an output of a VCO 18 and to an input of a quadrature phase shift circuit 14. The output of mixer circuit 12 is connected to a terminal 23 of a phase detector circuit 35. Mixer circuit 12 is also referred to as an in-phase translator (I-mixer) because it generates a translated signal, $V_{OUT1}$, that is a reference representation of the signal $RF_{IN}$.

A second input of mixer circuit 16 is coupled to the output of VCO 18 via quadrature phase shift circuit 14. VCO 18 generates an output signal $VCO_I$ which is phase shifted by quadrature phase shift circuit 14. The phase shifted signal appears at the output of quadrature phase shift circuit 14 as output signal $VCO_Q$. An output of mixer circuit 16 is connected to a terminal 24 of phase detector circuit 35. Mixer circuit 16 is referred to as a quadrature translator (Q-mixer) because it generates a translated signal, $V_{OUT2}$, that is in quadrature with the reference representation of the signal $V_{OUT1}$.

Phase detector circuit 35 has input terminals 23 and 24 and an output terminal 34. Phase detector circuit 35 includes phase detector 26 having a first input connected to terminal 23 of phase detector circuit 35 for receiving the signal $V_{OUT1}$. Phase detector circuit 35 further includes a phase shift circuit (Ø) 20 and a phase detector 36. Phase shift circuit 20 has a first input commonly connected to a second input of phase detector 26, a first input of phase detector 36, and to terminal 24 of phase detector circuit 35. A terminal 25 of phase shift circuit 20 is connected to a second input of phase detector 36. A signal $V_{OUT3}$ generated at terminal 25 of phase shift circuit 20 is phase shifted with respect to the signal $V_{OUT2}$. Further, a summing circuit 27 has an input connected to terminal 23 of phase detector circuit 35 and an input connected to terminal 25 of phase shift circuit 20. Summing circuit 27 has an output terminal 29.

In addition, terminals 28 and 38 of respective phase detectors 26 and 36 are connected to corresponding inputs of a difference circuit 30. An output of difference circuit 30 serves as output terminal 34 of phase detector circuit 35. Output terminal 34 is connected to a second input of phase shift circuit 20. Alternatively, output terminal 34 could be connected to a second input (not shown) of phase shift circuit 14. It should be noted that signal $RF_{IN}$ is in the Radio Frequency (RF) range and is translated to signals $V_{OUT1}$, and $V_{OUT3}$ that are in the Intermediate Frequency (IF) range.

Although mixer circuits 12 and 16, VCO 18, and phase detector circuit 35 have been illustrated in FIG. 1 as having single-ended inputs and outputs for simplicity, the signals $RF_{IN}$, $VCO_I$, $VCO_Q$, $V_{OUT1}$, $V_{OUT2}$, $V_{OUT3}$, and the feedback signal at output terminal 34 of phase detector circuit 35 may be differential signals. Thus, image reject receiver 10 of the present invention is not limited to operating with single-ended signals.

Figure 2:
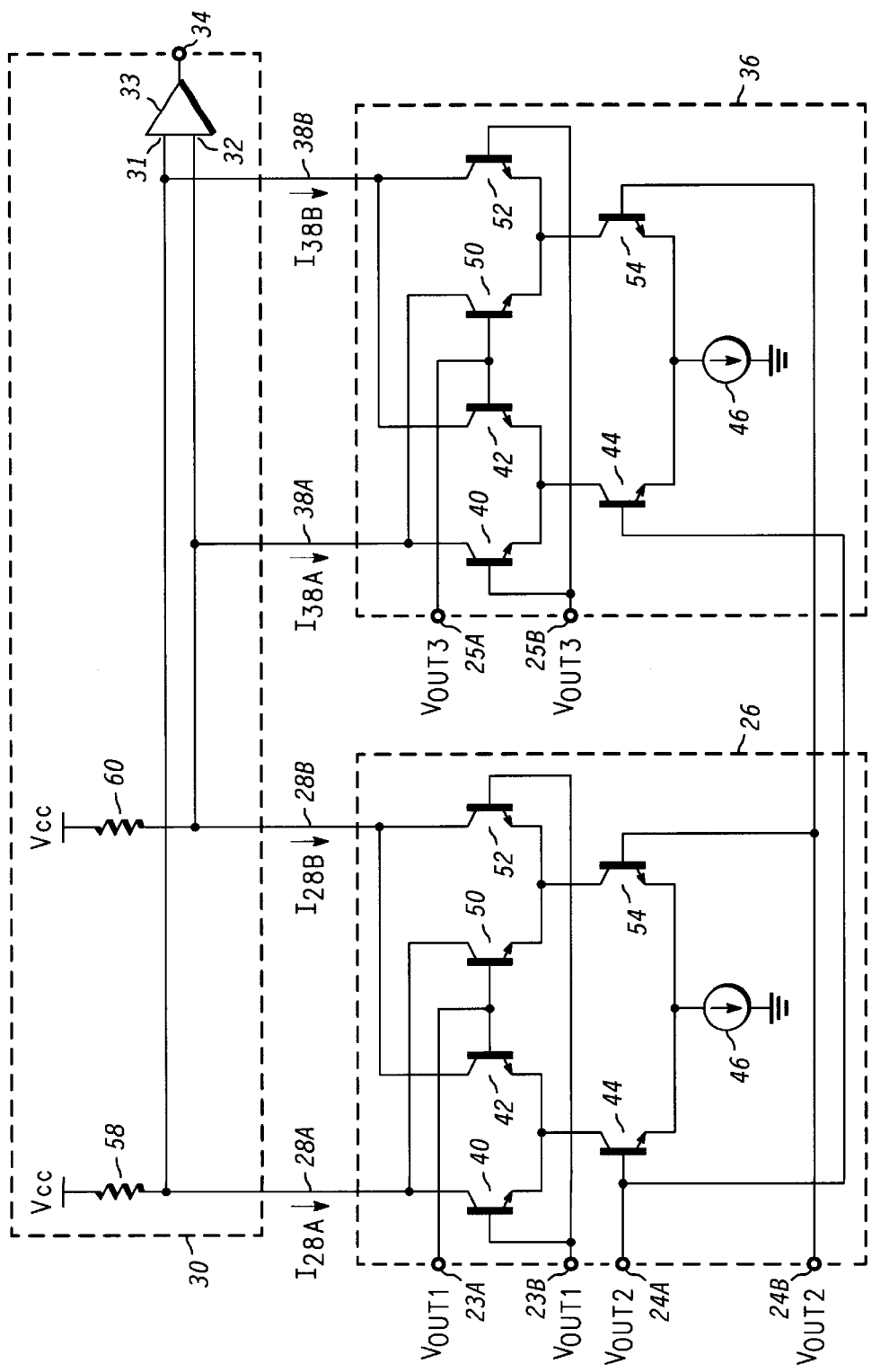
FIG. 2 is a schematic diagram of a portion of a phase detector circuit of FIG. 1.

FIG. 2 is a schematic diagram of a portion of phase detector circuit 35 of FIG. 1 having phase detectors 26 and 36. It should be noted that the same reference numbers are used in the figures to denote the same elements. It should be further noted that the embodiment illustrated in FIG. 2 is a differential embodiment. Therefore, phase detector 26 has terminals 23A and 23B, terminals 24A and 24B, and terminals 28A and 28B. Phase detector 36 has terminals 24A and 24B, terminals 25A and 25B, and terminals 38A and 38B. The letters A and B have been appended to reference numbers 23, 24, and 25 to denote differential inputs, and to reference numbers 28 and 38 to denote differential outputs. Phase detectors 26 and 36 each include a differential pair of NPN bipolar transistors 44 and 54, wherein an emitter of transistor 44 is connected to an emitter of transistor 54. The emitters of transistors 44 and 54 are coupled to ground through a current source 46. The bases of transistors 44 and 54 are connected to respective terminals 24A and 24B of phase detector circuit 35. It should be noted that terminals 24A and 24B (corresponding to terminal 24 in FIG. 1) are coupled for receiving the differential signal $V_{OUT2}$.

In addition, phase detectors 26 and 36 each include a second differential pair of NPN bipolar transistors 40 and 42. Transistors 40 and 42 are connected as a differential pair, wherein an emitter of transistor 40 is connected to an emitter of transistor 42. The emitters of transistors 40 and 42 are connected to the collector of transistor 44. The collectors of transistors 40 and 42 in phase detector 26 are connected to terminals 28A and 28B, respectively. The collectors of transistors 40 and 42 in phase detector 36 are connected to terminals 38A and 38B, respectively.

Further, phase detectors 26 and 36 each include a third differential pair of NPN bipolar transistors 50 and 52. Transistors 50 and 52 are connected as a differential pair, wherein an emitter of transistor 50 is connected to an emitter of transistor 52. The emitters of transistors 50 and 52 are commonly connected to the collector of transistor 54.

In phase detector 26, the commonly connected bases of transistors 42 and 50 and the commonly connected bases of transistors 40 and 52 are connected to respective terminals 23A and 23B. The collectors of transistors 50 and 52 are connected to terminals 28A and 28B, respectively. It should be noted that terminals 23A and 23B (corresponding to terminal 23 in FIG. 1) are coupled for receiving the differential signal $V_{OUT1}$.

In phase detector 36, the commonly connected bases of transistors 42 and 50 and the commonly connected bases of transistors 40 and 52 are connected to respective terminals 25A and 25B. The collectors of transistors 50 and 52 are connected to terminals 38A and 38B, respectively. It should be noted that terminals 25A and 25B (corresponding to terminal 25 in FIG. 1) are coupled for receiving the differential signal $V_{OUT3}$.

In addition, for phase detector 26, the current $I_{28A}$ is supplied to transistors 40 and 50 through terminal 28A and current $I_{28B}$ is supplied to transistors 42 and 52 through terminal 28B. For phase detector 36, the current $I_{38A}$ is supplied to transistors 40 and 50 through terminal 38A and current $I_{38B}$ is supplied to transistors 42 and 52 through terminal 38B.

Difference circuit 30 of phase detector circuit 35 includes pull-up resistors 58 and 60 and a differential amplifier 33. The common connection of terminals 28A and 38B of respective phase detectors 26 and 36 are connected to input 31 of differential amplifier 33. Input 31 is coupled to a power supply conductor for receiving an operating voltage $V_{CC}$ via resistor 58. Further, the common connection of terminals 28B and 38A of respective phase detectors 26 and 36 is connected to input 32 of differential amplifier 33. Input 32 is coupled to the power supply conductor for receiving an operating voltage $V_{CC}$ via resistor 60. An output of differential amplifier 33 serves as output terminal 34 of phase detector circuit 35. Alternatively, a person skilled in the art could replace resistors 58 and 60, and differential amplifier 33 with current mirrors and a push-pull driver circuit (not shown). The output of the push-pull driver circuit would provide a feedback signal to the input of quadrature phase shift circuit 20.

It should be noted that in the present invention the transistors of phase detector circuit 35 are not limited to being bipolar transistors. For example, transistors having a control terminal and two current carrying terminals such as, for example, Metal Oxide Semiconductor Field Effect Transistors (MOSFETs), Gallium Arsenide Field Effect Transistors (GaAs FETs), or the like, could be used.

Figure 3:
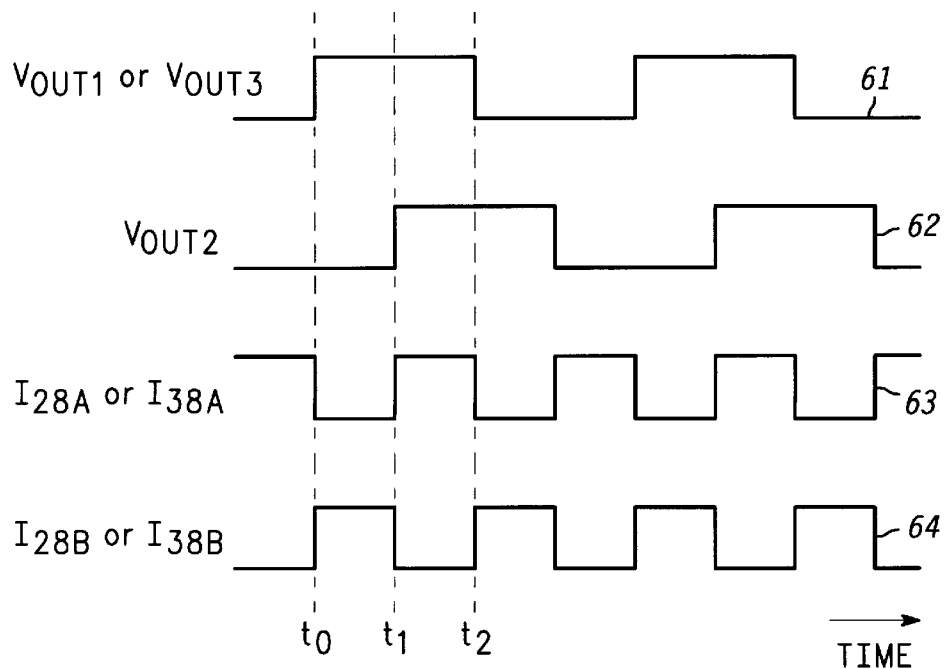
FIG. 3 illustrates input signal waveforms and corresponding output current waveforms for the phase detector circuits of FIG. 1.

FIG. 3 illustrates input signal waveforms and corresponding output current waveforms for phase detectors 26 and 36 as shown in FIG. 1. The horizontal axis represents time and the vertical axis represents a voltage or current amplitude. It should be noted that waveforms 61 and 62 have amplitudes measured as a voltage, while waveforms 63 and 64 have amplitudes measured as a current. It should be further noted that FIG. 3 illustrates two sets of signals. A first set of signals of phase detector 26, i.e., signals $V_{OUT1}$, $V_{OUT2}$, $I_{28A}$, and $I_{28B}$, are represented by waveforms 61, 62, 63, and 64, respectively. A second set of signals of phase detector 36, i.e., signals $V_{OUT3}$, $V_{OUT2}$, $I_{38A}$, and $I_{38B}$, are also represented by waveforms 61, 62, 63, and 64, respectively.

The signal $V_{OUT2}$, represented by waveform 62, is nominally ninety degrees out-of-phase with respect to either of the signals $V_{OUT1}$, and $V_{OUT3}$ represented by waveform 61. In other words, waveform 61 illustrates a signal having transitions at times $t_0$ and $t_2$ and waveform 62 illustrates a signal having a transition at time $t_1$. Time $t_1$ is centered between times $t_0$ and $t_2$. It should be further noted that currents $I_{28A}$ and $I_{28B}$ are complementary signals having an equal mark to space relationship when the signals $V_{OUT1}$, and $V_{OUT2}$ have a phase relationship of ninety degrees. In other words, the time difference of $(t_2-t_1)$ is equivalent to the time difference of $(t_1-t_0)$. A mark is the portion of waveform 63 or waveform 64 where the signal has a high amplitude. A space is the portion of waveform 63 or waveform 64 where the signal has a low amplitude. Likewise, the currents $I_{38A}$ and $I_{38B}$ are complementary signals having an equal mark to space relationship when the signals $V_{OUT3}$ and $V_{OUT2}$ have a phase relationship of ninety degrees. Thus, when the inputs of phase detectors 26 and 36 have a quadrature relationship, the outputs are complementary signals that exhibit a fifty percent duty cycle.

It should be understood that the mark to space relationship between signals $I_{28A}$ and $I_{28B}$ changes when the signals $V_{OUT1}$, and $V_{OUT2}$ do not have a phase relationship of ninety degrees. In other words, waveforms 63 and 64 exhibit duty cycles other than a duty cycle of fifty percent. Similarly, the mark to space relationship between signals $I_{38A}$ and $I_{38B}$ changes when the signals $V_{OUT3}$ and $V_{OUT2}$ do not have a phase relationship of ninety degrees.

Figure 4:
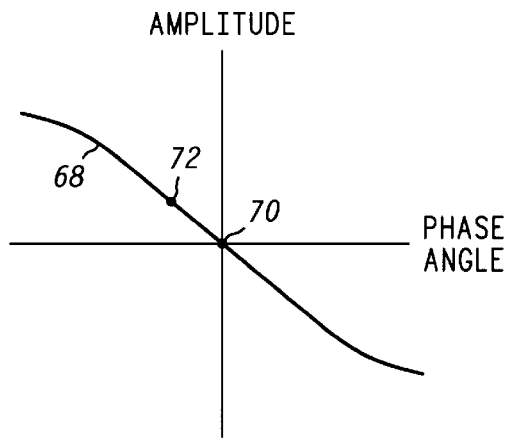
FIGS. 4–5 illustrate amplitude versus phase angle plots for the phase detector circuits of FIG. 1.

FIG. 4 illustrates an amplitude versus phase angle plot for phase detector 26 of FIG. 1. Referring to FIGS. 1 and 4, the horizontal axis illustrates the difference in phase angles between the signals at terminals 23 and 24. The vertical axis illustrates the amplitude of the signal at terminal 28, i.e., the difference between the Direct Current (DC) components of the currents $I_{28A}$ and $I_{28B}$ (see FIG. 2). Thus, curve 68 illustrates a relationship between the difference in phase angles of the signals at terminals 23 and 24 and the amplitude of the current signal at terminal 28. By way of example, a signal at terminal 23 that is ninety degrees out of phase with respect to a signal at terminal 24 generates a signal at terminal 28 having an amplitude of zero, i.e., point 70 on curve 68. On the other hand, signals at terminals 23 and 24 being either more or less than ninety degrees out of phase with respect to each other cause a non-zero current amplitude for the signal at terminal 28, i.e., point 72 on curve 68.

Figure 5:
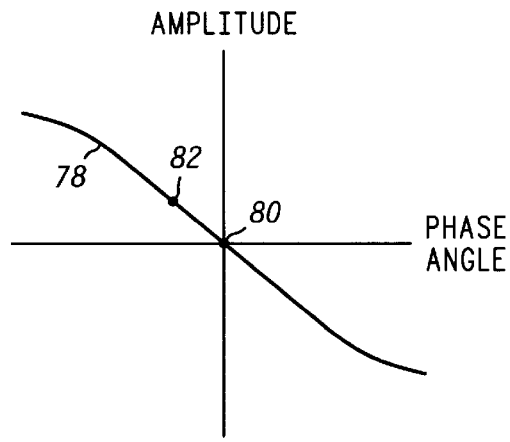

Likewise, FIG. 5 illustrates an amplitude versus phase angle plot for phase detector 36 of FIG. 1. Referring to FIGS. 1 and 5, the horizontal axis illustrates the difference in phase angle between the signals at terminals 24 and 25. The vertical axis illustrates the amplitude of the signal at terminal 38, i.e., the difference between the DC components of the currents $I_{38A}$ and $I_{38B}$ (see FIG. 2). Thus, curve 78 illustrates a relationship between the difference in phase angles of signals at terminals 24 and 25 and the amplitude of the signal at terminal 38. By way of example, a signal at terminal 24 that is ninety degrees out of phase with respect to a signal at terminal 25 generates a signal at terminal 38 having an amplitude of zero, i.e., point 80 on curve 78. Signals at terminals 24 and 25 that do not have a quadrature phase relationship with respect to each other have a non-zero current amplitude for the signal at terminal 38, i.e., point 82 on curve 78.

Figure 6:
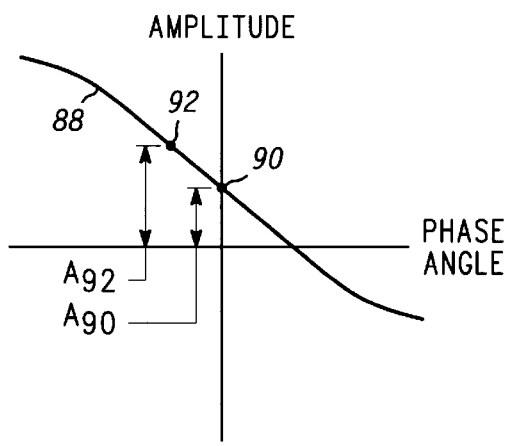
FIGS. 6–7 illustrate the effect of time delays on the amplitude versus phase angle plots for the phase detector circuits of FIG. 1.
Figure 7:
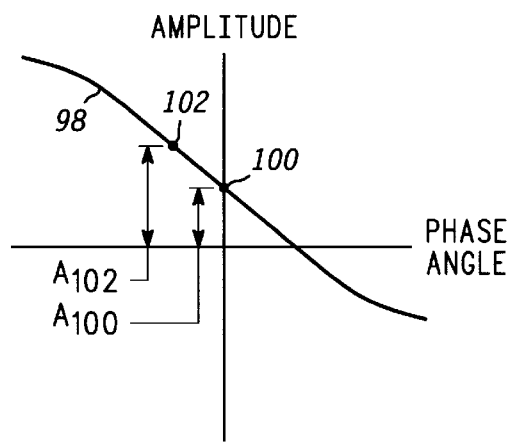

FIGS. 6–7 are plots illustrating the effect of time delay differences on the amplitude versus phase angle plot for the phase detectors of FIG. 1. For instance, curve 88 in FIG. 6 illustrates the effects of time delay differences along the signal paths between terminals 23 and 28 and between terminals 24 and 28. The time delay differences cause curve 88 of FIG. 6 to be shifted in comparison with curve 68 of FIG. 4, in which the effect of time delays are ignored. In other words, FIG. 6 illustrates that an output signal at terminal 28 has an amplitude $A_{90}$ that is caused by signal path time delays, i.e., point 90 on curve 88. Thus, even though signals at terminals 23 and 24 have a quadrature phase relationship, the signal at terminal 28 has a non-zero amplitude due to differences in signal path time delays.

It should be noted that point 92 on curve 88 illustrates that an output signal of phase detector 26 has an amplitude $A_{92}$. Amplitude $A_{92}$ has a first amplitude component, i.e., amplitude $A_{90}$, that results from a time delay difference in generating the output signal at terminal 28 from signals at terminals 23 and 24 of phase detector 26. A second amplitude component of amplitude $A_{92}$, i.e., amplitude $(A_{92}-A_{90})$, results from the signals at terminals 23 and 24 not having a quadrature phase relationship.

Curve 98 in FIG. 7 illustrates the effects of time delay differences along the signal paths between terminals 24 and 38 and between terminals 25 and 38. Time delay differences cause curve 98 in FIG. 7 to be shifted in comparison with curve 78 of FIG. 5. It should be noted that curve 78 in FIG. 5 ignores the effect of time delays. Point 102 on curve 98 illustrates that a signal at terminal 38 has two amplitude components. The amplitude $A_{100}$, i.e., point 100 on curve 98, results from a time delay difference in generating the output signal at terminal 38 from signals at terminals 24 and 25. The second amplitude component is the difference between amplitude $A_{102}$ and amplitude $A_{100}$, which results when signals at terminals 24 and 25 do not have a quadrature phase relationship.

Referring now to FIG. 1, the operation of image reject receiver 10 will be described. A multiplication of the signals $RF_{IN}$ and $VCO_I$ by mixer circuit 12 results in a signal $V_{OUT1}$ having a component that is the sum of the signals $RF_{IN}$ and $VCO_I$ and another component that is the difference of the signals $RF_{IN}$ and $VCO_I$. A filter (not shown) allows only the difference term as a translated first replica of the signal $RF_{IN}$. In addition, an undesired image at the input of image reject receiver 10 having a frequency below that of the signal $RF_{IN}$ is also translated in frequency by mixer circuit 12. Thus, in addition to the desired first replica signal, the signal $V_{OUT1}$ also has a frequency component that is an unwanted first image. It should be noted that the undesired image at the input of image reject receiver 10 could have a frequency above that of the signal $RF_{IN}$ and be translated by mixer circuit 12.

Similarly, the sum and difference frequencies of the signals $RF_{IN}$ and $VCO_Q$ are generated through the multiplication of these signals by mixer circuit 16. The signal $V_{OUT2}$ is the translated second replica of the signal $RF_{IN}$, but phase shifted by ninety degrees with respect to the signal $V_{OUT1}$. Again, an undesired image at the input of image reject receiver 10 having a frequency below that of the signal $RF_{IN}$ is also translated in frequency by mixer circuit 16. Thus, the signal $V_{OUT2}$ has both the desired second replica signal and an unwanted second image. It should be noted that the undesired image at the input of image reject receiver 10 could have a frequency above that of the signal $RF_{IN}$ and be translated by mixer circuit 16.

Phase shift circuit 20 shifts the phase of the signal $V_{OUT2}$, i.e., the desired second replica signal and the unwanted second image, by about ninety degrees to generate the output signal $V_{OUT3}$. Thus, the signals $V_{OUT1}$ and $V_{OUT3}$ have unwanted images that are one hundred and eighty degrees out-of-phase and replica signals that are in-phase with respect to each other. Ideally, adding the signals $V_{OUT1}$ and $V_{OUT3}$ to generate the sum of the signals at output terminal 29 of summing circuit 27 causes cancellation of the unwanted images that are out-of-phase with respect to each other and only the desired first and second replica signals would remain because they are in-phase.

However, the unwanted images being one hundred and eighty degrees out-of-phase depends on both phase shift circuits 14 and 20 generating output signals that are shifted ninety degrees from their respective input signals. Alternatively, the unwanted images being out-of-phase depends on the combined phase shift of phase shift circuits 14 and 20 equaling one hundred and eighty degrees. A combined phase shift that is not equal to one hundred and eighty degrees causes a quadrature error term in the output of difference circuit 30. In other words, the quadrature error term is a phase error value that signifies the undesired image has not been completely rejected.

Phase detector circuit 35 receives the signals $V_{OUT1}$ $V_{OUT2}$, and $V_{OUT3}$ and generates a feedback signal that is transmitted to quadrature phase shift circuit 20. The feedback signal adjusts the phase shift of phase shift circuit 20 such that the desired signals $V_{OUT1}$ and $V_{OUT3}$ have zero degrees of phase separation and the unwanted image signals have one hundred and eighty degrees of phase separation, which reduces the amplitude of the feedback signal at output terminal 34. It should be noted that the feedback signal updates phase shift circuit 20 during a time period that allows training of image reject receiver 10. It should be further noted that the undesired image is not present during this training time period.

FIG. 6 illustrates that point 92 on curve 88 has an amplitude $A_{92}$ that includes a phase component in accordance with the phase relation between signals $V_{OUT1}$ and $V_{OUT2}$ and a time delay component, i.e., amplitude $A_{90}$. Likewise, FIG. 7 illustrates that point 102 on curve 98 has an amplitude $A_{102}$ that includes a phase component in accordance with the phase relation between signals $V_{OUT2}$ and $V_{OUT3}$ and a time delay component, i.e., amplitude $A_{100}$. Phase detectors 26 and 36 are similarly configured to have matching time delays. Thus, the amplitude components caused by the time delays through phase detectors 26 and 36 are substantially equivalent, i.e., amplitude $A_{90}$ is about equal to amplitude $A_{100}$.

The quadrature error term in the feedback signal at output terminal 34 is the difference between the amplitudes of the signals at terminals 28 and 38. More particularly, with amplitude $A_{90}$ substantially equivalent to amplitude $A_{100}$, the amplitude components due to time delays cancel each other in generating the difference value at output terminal 34 of difference circuit 30. Thus, the remaining amplitude components of the signal at output terminal 34 are due to phase shift errors in phase shift circuits 14 and 20. The error voltage generated at output terminal 34 adjusts the phase of the signal $V_{OUT3}$ and forces the phase relationship of the signals $V_{OUT1}$ and $V_{OUT3}$ to be substantially zero. The unwanted images have a phase separation of about one hundred and eighty degrees and the amplitude of the quadrature error term at output terminal 34 has a value of about zero (assuming equal amplitudes for the unwanted images).

Briefly referring to FIG. 3, waveforms 63 and 64 illustrate output currents that are generated when the desired first and second replica portions of the input signals $V_{OUT1}$ and $V_{OUT3}$ are in-phase. In other words, signals $V_{OUT1}$ and $V_{OUT2}$ have a quadrature relationship and signals $V_{OUT2}$ and $V_{OUT3}$ have a quadrature relationship. Thus, an average value of current $I_{28A}$ is substantially equal to an average value of current $I_{28B}$ when waveforms 63 and 64 have equal marks and spaces. In addition, current $I_{38A}$ and current $I_{38B}$ have about equal average values when waveforms 63 and 64 have equal marks and spaces. Further, the difference value at output terminal 34 of difference circuit 30 has a value of about zero when equivalent currents in phase detectors 26 and 36 cancel each other.

By locking the desired first and second replica portions of the input signals $V_{OUT1}$ and $V_{OUT3}$ in-phase, the unwanted images are one hundred and eighty degrees out-of-phase and cancel each other when added. On the other hand, a combined phase shift of phase shift circuits 14 and 20 that does not equal one hundred and eighty degrees causes the amplitude of the feedback signal to increase above zero. The feedback signal adjusts the phase shift of phase shift circuit 20 to reduce the amplitude of the quadrature error term in the feedback signal and, thereby, causes a higher rejection of the undesired image. An equilibrium point is reached when the amplitude of the quadrature error term in the feedback signal has a steady value and the signals $V_{OUT1}$ and $V_{OUT3}$ are in-phase. Thus, the undesired image has been rejected.

Figure 8:
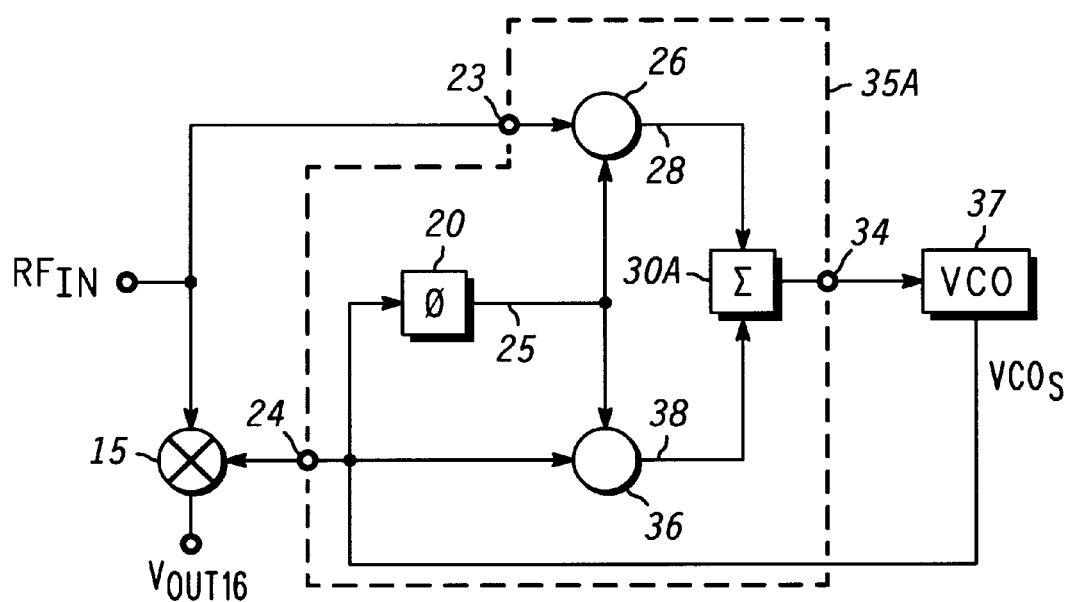
FIG. 8 is a block diagram of a demodulator circuit in accordance with the present invention.

FIG. 8 is a block diagram of a demodulator circuit 17 in accordance with the present invention. Demodulator circuit 17 includes a multiplier circuit 15 having a first input for receiving the signal $RF_{IN}$ and a phase detector circuit 35A that has an input connected to a terminal 23, for receiving the signal $RF_{IN}$. The letter A has been appended to reference number 35 to indicate that the connections of phase detector circuit 35A are different from those of phase detector circuit 35 shown in FIG. 1. Phase detector circuit 35A has a second input at terminal 24 and an output at terminal 34. More particularly, phase detector circuit 35A includes a phase detector 26 having a first input connected to terminal 23 and a phase detector 36 having a first input connected to terminal 24. Phase detector 26 has a second input commonly connected to a second input of phase detector 36 and to an output of a phase shift circuit (Ø) 20. An input of phase shift circuit 20 is commonly connected to terminal 24, to a second input of multiplier circuit 15, and to an output of VCO 37. An output of multiplier circuit 15 provides the signal $V_{OUT16}$. Demodulator circuit 17 further includes a summing circuit 30A having a first input connected to output 28 of phase detector 26 and a second input connected to output 38 of phase detector 36. It should be noted that the letter A has been appended to summing circuit 30A to differentiate it from difference circuit 30 that is illustrated in FIG. 1. Summing circuit 30A has an output connected to terminal 34 of phase detector circuit 35A. Further, output terminal 34 is connected to an input of VCO 37. VCO 37 generates a signal $VCO_S$.

In operation, the output of VCO 37 locks in-phase to the carrier of the signal $RF_{IN}$ and generates a signal, $VCO_S$, which is fed to phase detector circuit 35A and to multiplier circuit 15. Phase detector circuit 35A generates an output error signal in accordance with the phase difference between the signals $VCO_S$ and $RF_{IN}$. The signal generated at output terminal 34 is used to force the phase of the signal $VCO_S$ to match the phase of the signal $RF_{IN}$. Multiplier circuit 15 generates an output signal in accordance with the carrier signal $VCO_S$ and the signal $RF_{IN}$. The signal $V_{OUT16}$ generated by multiplier circuit 15 is a demodulated baseband receiver output signal. Baseband is the frequency band occupied by the aggregate of the transmitted signals used to modulate the carrier signal $RF_{IN}$.

By now it should be appreciated that a structure and a method have been provided for detecting the phase difference between two signals. By generating a difference value in accordance with the output signals of two phase detectors, the phase shift associated with time delays through both phase detectors are canceled, the signals $V_{OUT1}$ and $V_{OUT3}$ are phase locked at zero degrees as opposed to the normal ninety degrees, and a higher frequency of operation is achieved compared to digital zero degree phase detectors. Directly phase locking the replica signals at zero degrees through cancellation of phase detector time delays allows a higher level of image rejection to be achieved. In addition, the summation of the signals at the outputs of the two phase detectors results in a reduced high frequency component of the output signal and, thereby, reduces the radiation and filtering requirements of the image reject receiver and amplitude modulated receiver.

What is claimed is:

1. A phase detector circuit, comprising:

a voltage controlled oscillator (VCO);

a first mixer circuit having a first input coupled for receiving a modulated signal and a second input coupled to an output of the VCO;

a first phase shifter having an input coupled to the output of the VCO;

a second mixer circuit having a first input coupled for receiving the modulated signal and a second input coupled to an output of the first phase shifter;

a first phase detector having a first input coupled to an output of the first mixer circuit;

a second phase detector having a first input coupled to an output of the second mixer circuit and a second input coupled to a second input of the first phase detector; and a difference circuit receiving output signals supplied by the first and second phase detectors and generating a difference signal.

2. The phase detector circuit of claim 1, further comprising a second phase shifter that has a first input coupled for receiving the difference signal and a second input coupled to the output of the second mixer circuit, and an output coupled to the first input of the second phase detector.

3. A down converter, comprising:

a phase shifter having a first input, a second input and a output;

a first phase detector having first and second inputs and a output, wherein the first input is coupled for receiving a first translated signal, the second input is coupled to the first input of the phase shifter, and the output provides a first phase error value;

a second phase detector having first and second inputs and a output, wherein the first input is coupled to the output of the phase shifter, the second input is coupled to the first input of the phase shifter, and the output provides a second phase error value; and a difference circuit having first and second inputs coupled for receiving the first and second phase error values, and an output coupled to the second input of the phase shifter.

4. The down converter of claim 3, wherein the first and second inputs of the first and second phase detectors are differential inputs.

5. The down converter of claim 3, wherein the outputs of the first and second phase detectors are differential outputs.

6. The down converter of claim 3, wherein the output of the difference circuit is a single-ended output.

* * * * *